United States Patent
Haroun et al.

(10) Patent No.: US 7,804,433 B1
(45) Date of Patent: Sep. 28, 2010

(54) METHODS AND APPARATUS FOR ERROR CANCELATION IN CALIBRATED CURRENT SOURCES

(75) Inventors: Baher Haroun, Allen, TX (US); Gaurav Chandra, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 12/423,667

(22) Filed: Apr. 14, 2009

(51) Int. Cl.
*H03M 1/10* (2006.01)
(52) U.S. Cl. ........................... 341/120; 341/144
(58) Field of Classification Search ............ 341/120, 341/136, 144
See application file for complete search history.

(56) References Cited

U.S. PATENT DOCUMENTS

| | | | |
|---|---|---|---|
| 4,967,140 A | 10/1990 | Groeneveld et al. | |
| 5,021,784 A | 6/1991 | Groeneveld et al. | |
| 5,870,044 A * | 2/1999 | Dell'ova et al. | 341/120 |
| 6,130,632 A * | 10/2000 | Opris | 341/120 |
| 6,331,830 B1 * | 12/2001 | Song et al. | 341/121 |
| 6,507,296 B1 * | 1/2003 | Lee et al. | 341/120 |
| 7,002,402 B2 * | 2/2006 | Boxho | 327/543 |
| 2003/0094998 A1 | 5/2003 | Schofield et al. | |

OTHER PUBLICATIONS

Groeneveld et al., "A Self-Calibration Technique for Monolithic High-Resolution D/A Converters," IEEE Journal of Solid-State Circuits, vol. 24, No. 6, Dec. 1989, pp. 1517-1522.

* cited by examiner

*Primary Examiner*—Khai M Nguyen
(74) *Attorney, Agent, or Firm*—Ronald O. Neerings; Wade James Brady, III; Frederick J. Telecky, Jr.

(57) ABSTRACT

Methods and apparatus for error cancelation in calibrated current sources are disclosed. In an example, a digital to analog converter to convert digital bits into an analog output signal is described, including a plurality of current sources, a calibrator, and a current source selector. The example current sources output substantially identical currents, and the calibrator is selectively coupled to sequentially calibrate the current sources to a reference current. The example current source selector assigns respective ones of the plurality of current sources to the digital bits in accordance with a bit-to-current source sequence selected to reduce current error in the analog output and changes the assignments based on the current source coupled to the calibrator.

20 Claims, 13 Drawing Sheets

| B2 | B1 | B0 | NUMBER OF CURRENT SOURCES |
|---|---|---|---|
| 0 | 0 | 0 | 0 |
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

*FIG. 14*

| T3 | T2 | T1 | B0 | NUMBER OF CURRENT SOURCES |
|---|---|---|---|---|
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 1 | 0 | 4 |
| 0 | 1 | 1 | 1 | 5 |
| 1 | 1 | 1 | 0 | 6 |
| 1 | 1 | 1 | 1 | 7 |

METHODS AND APPARATUS FOR ERROR CANCELATION IN CALIBRATED CURRENT SOURCES

FIELD OF THE DISCLOSURE

This disclosure relates generally to current sources and, more particularly, to methods and apparatus for error cancelation in calibrated current sources.

BACKGROUND

Multiple current sources are often used in digital-to-analog converters (DACs). In such contexts, the current sources are intended to be identical. To achieve this identity, the current sources are calibrated against a reference source. As fabrication technologies continue to produce smaller integrated circuits, high precision DACs are difficult to produce due to manufacturing variances and noise levels. The above-mentioned calibration of the current sources during operation of the circuit can provide improved output precision.

SUMMARY

Methods and apparatus for ripple cancelation in calibrate current sources are disclosed. In some examples, a digital to analog converter to convert digital bits into an analog output signal includes a plurality of current sources, a calibrator, and a current source selector. The example current sources output substantially identical currents, and the calibrator sequentially calibrates the current sources to a reference current. The example current source selector assigns respective ones of the plurality of current sources to the digital bits in accordance with a bit-to-current source sequence selected to reduce current error in the analog output. The assignments of the plurality of current sources to the digital bits are changed as the current source undergoing calibration is changed.

Additionally, some example methods to convert digital bits into an analog output signal include configuring a plurality of current sources to output substantially identical current levels, selecting a first one of the current sources for calibration according to a calibration sequence, and assigning respective ones of the plurality of current sources to the digital bits in accordance with a bit-to-current source sequence selected to reduce current error in the analog output. The bit-to-current source sequence is synchronized with the calibration sequence.

BRIEF DESCRIPTION OF THE DRAWINGS

FIG. 14 is a table illustrating numbers of current sources used to represent example three-bit weighted binary input codes.

FIG. 15 is a table illustrating numbers of current sources used to represent example four-bit modified thermometric input codes.

DETAILED DESCRIPTION

Certain examples are shown in the above-identified figures and described in detail below. In describing these examples, like or identical reference numbers will be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof. Thus, although the following examples describe methods and apparatus including logic implemented in hardware, it should be noted that such systems are merely illustrative and should not be considered as limiting. For example, it is contemplated that any or all of the example logic could be embodied exclusively in hardware, exclusively in software, exclusively in firmware or in any combination of hardware, firmware and/or software. Accordingly, while the following describes example methods and apparatus, persons of ordinary skill in the art will readily appreciate that the examples are not the only way to implement such methods and apparatus.

Figure 1:
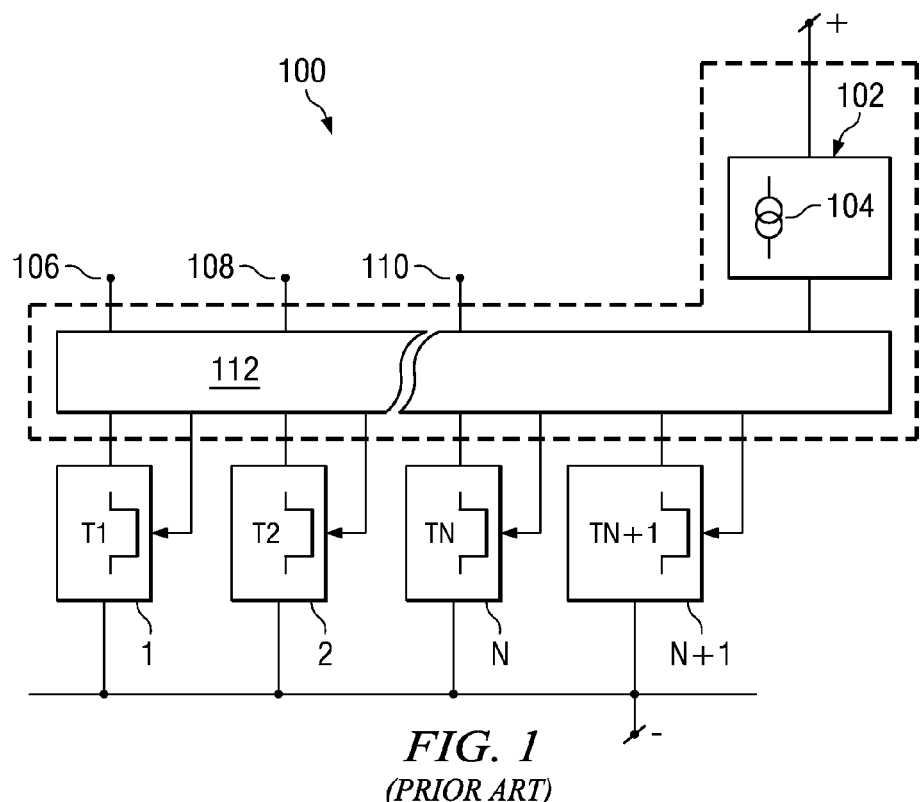
FIG. 1 is a schematic diagram of a conventional current source configuration and calibrator circuit for a conventional digital to analog converter.

FIG. 1 is a schematic diagram of a conventional current source configuration 100 and calibrator circuit 102 for a conventional digital to analog converter (DAC). The conventional current source configuration 100 includes N substantially identical current supplies 1 through N which are respectively coupled to output terminals 106, 108, through 110. The current supplies are selectively coupled to their respective output terminals 106, 108, through 110 in accordance with a digital signal to be converted into an analog signal. In particular, each current source corresponds to a bit of the digital signal. When a bit of the digital signal is set to logic 0, the current source corresponding to that bit is disconnected from its respective output terminal as part of the digital to analog conversion process. When, on the other hand, a bit of the digital signal is set to logic 1, the current source corresponding to that bit is connected to its respective output terminal as part of the digital to analog conversion process.

The calibrator circuit 102 includes a current source 104, which outputs a reference current. The number of current sources 1, 2, through N is equal to the number of output terminals 106, 108, through 110. To ensure the current sources provide substantially identical currents, the current sources 1, 2, through N are periodically calibrated by the calibrator 102 to substantially equal the reference current. To this end, the conventional current source configuration 100 includes a substitute current source N+1 to allow the current source configuration 100 to continue operation while the calibrator 102 calibrates one of the current sources 1, 2, through N+1. The calibrator 102 adjusts the current sources 1, 2, through N+1 one at a time. In particular, when a switching network 112 couples the calibrator 102 to a selected one of the current sources, the additional current source N+1 operates in place of the current source 1, 2, through N that is currently being calibrated by the calibrator 102. As a result, the operation of the DAC is not interrupted by the calibration process.

Figure 2:
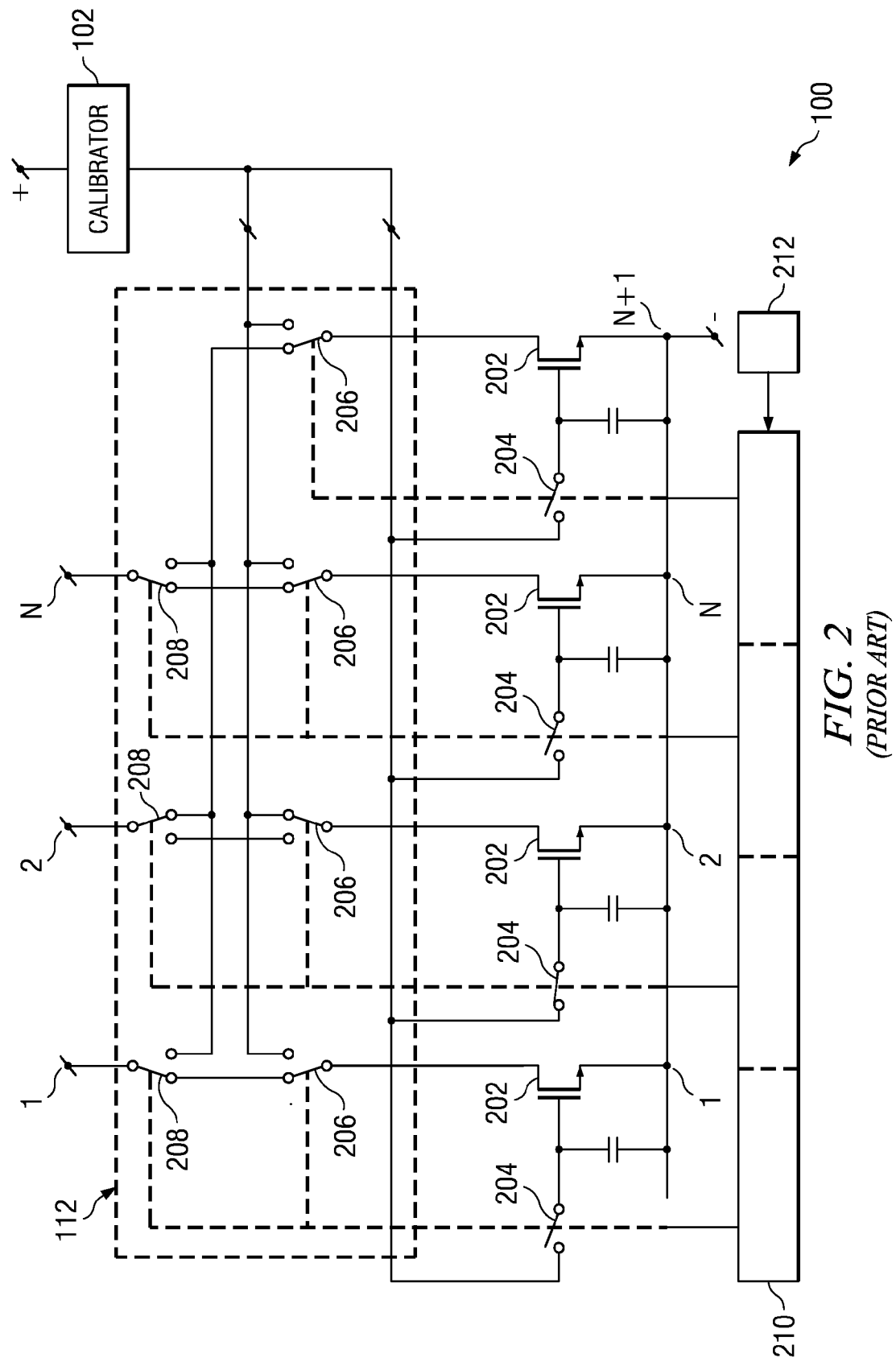
FIG. 2 is a more detailed schematic diagram of the circuit of FIG. 1.

FIG. 2 is a more detailed schematic illustration of the circuit 100 of FIG. 1. Each of the current sources 1, 2, through N+1 includes a transistor 202. The sources of the transistors are coupled to respective ones of the output terminals 106, 108, through 110. The states of the transistors 202 are switched to reflect a logic state of a corresponding bit of an input signal that is to be converted to an analog signal.

To selectively couple the current sources 1, 2, through N+1 to the calibrator 102 and decouple the current sources 1, 2, through N+1 from their respective output terminals 106, 108, through 110, the switching network 112 includes controlled switches 204 and 206. In order to selectively couple the substitute current source N+1 to the output terminal corresponding to the current source 1, 2, through N undergoing calibration, the switching network 112 includes switches 208. A shift register 210 controls the switches 204-208, such that one of the current sources 1, 2, through N+1 at a time is sequentially coupled to the calibrator 102 with the substitute current source N+1 connected in place of the current source being treated by the calibrator 102. A clock 212 provides a shift signal to the shift register 210. As the state(s) of the shift register 210 change, the states of the switches 204, 206, and 208 are changed to achieve the calibration sequence.

More detailed descriptions of the conventional current source configuration of FIG. 1 and the conventional switching network of FIG. 2 are provided by Groeneveld, et al. in U.S. Pat. No. 4,967,140, the entirety of which is hereby incorporated by reference.

Figure 3:
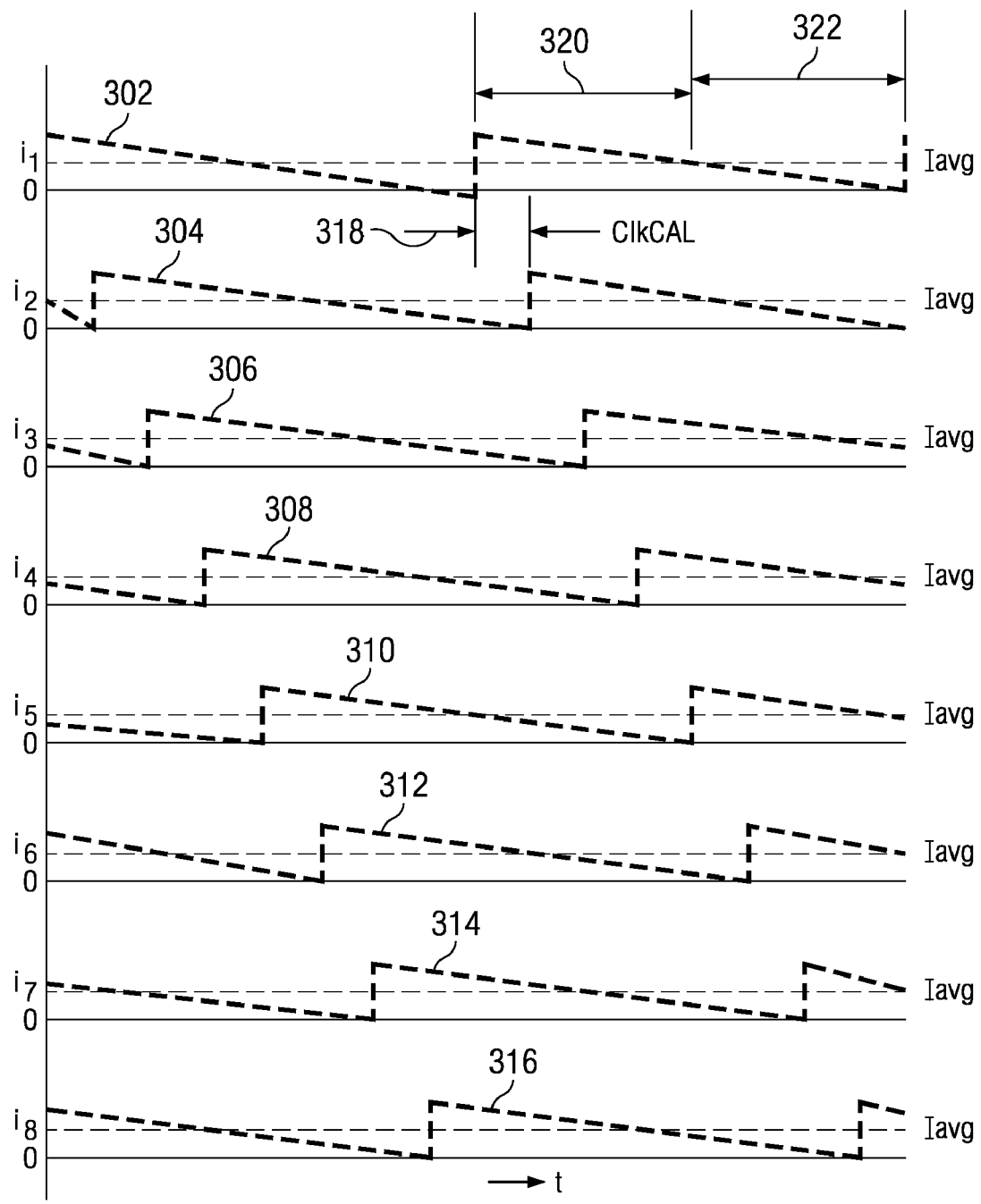
FIG. 3 is a graph of the output current waveforms of the conventional current sources of FIGS. 1 and 2 during a calibration cycle.

FIG. 3 is a graph of the output current waveforms 302-316 of the conventional current sources 1, 2, through N+1 of FIGS. 1 and 2 during a correction cycle. As illustrated in FIG. 3, each output current 302-316 outputs a substantially identical error signal. Error is introduced due to leakage of storage capacitors at the gates of transistors 202. Over time, the leakage reduces the current conducted by the transistor 202 and is shown herein as a linear reduction of current over time.

The current through each transistor 202 has an average current value Iavg. However, each output current 302-316 has a different phase. The phase difference between the output current 302 and the output current 304 is ClkCAL, which is the clock period of the clock 212 of FIG. 2. This same phase difference occurs between each pair of adjacent output currents (e.g., 302 and 304, 304 and 306, . . . , 316 and 302). The period of the phase difference ClkCAL is the time between calibrations of adjacent current sources, and is shown as reference numeral 318. The output current error signals produce ripple. Ripple produces noise.

A full calibration cycle, or (N+1)*ClkCAL, is the time during which all of the current sources 1 through N+1 are calibrated. The time to complete the calibration cycle is also the period of the output current error signal. One-half of the period is the time 320 necessary for a given output current (e.g., the output current for the current source 1) to decrease from the maximum current at calibration to the average current value Iavg. The other half of the period is the time 322 necessary for the output current to decrease from Iavg to the lowest value prior to the next calibration.

Figure 4:
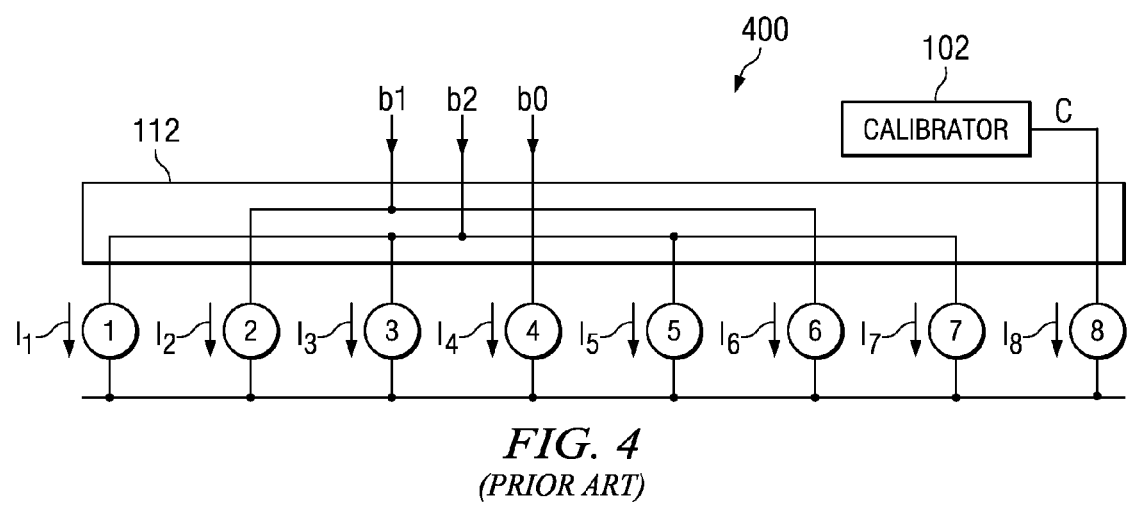
FIG. 4 is a schematic diagram of a conventional current source configuration to reduce the ripple in the output of the current source of FIG. 1.

FIG. 4 is a schematic diagram of a conventional current source configuration 400 configuration to reduce the ripple in the output of the current source configuration 100 of FIG. 1. The current source configuration 400 receives a three-bit input code in binary-weighted format and produces one of eight possible analog output currents based on the binary code. The three-bit input code includes a least significant bit (LSB) b0, a mid-level bit b1, and a most significant bit (MSB) b2. The current source configuration 400 includes seven current sources 1-7 to produce eight possible currents. The current source configuration 400 also includes a substitute current source 8 to permit current level correction (i.e., calibration) of one of the current sources 1-8 during operation of the current source configuration 400. A calibrator 102 is coupled to one of the eight current sources 1-8 at any given time to correct the corresponding current level of the current source 1-8. The current sources 1-8 are sequentially adjusted by the calibrator 102 in numeric order, from 1, 2, 3, and so on to 8. After calibrating current source 8 (i.e., the substitute current source), the calibrator returns to calibrate current source 1 and the cycle continues.

The illustrated example is for a DAC that converts a three-bit digital code into an analog signal. The bits b2, b1 and b0 correspond to the bits of the digital code, from most significant to least significant bit. The bits b2, b1, b0 control which current sources are coupled to the output of the DAC. The currents from the current sources that are coupled to the output of the DAC are summed to form the analog output signal corresponding to the digital code of the DAC. To this end, each bit b0, b1, and b2 of the digital code controls a number of the current sources 1-8 corresponding to its relative weight. Thus, the LSB (b0) controls one current source 4, the bit b1 controls two current sources 2 and 6, and the MSB (b2) controls four of the current sources 1, 3, 5, and 7. As a result, when the MSB (b2) is logic high, at least four current sources will contribute to the analog output of the DAC. The correlation between the bits b2, b1 and b0 and the number of current sources contributing to the analog output signal is shown in FIG. 14 for ease of reference. The current sources 1-7 controlled by each bit b0, b1, b2 are static; however, each bit will control the substitute current source 8 when one of its assigned current sources is being calibrated. As explained above, the switching network 112 replaces each current source 1-7, one at a time, with the substitute current source 8 to facilitate calibration of the current sources 1-8 without interrupting DAC operation.

Figure 5:
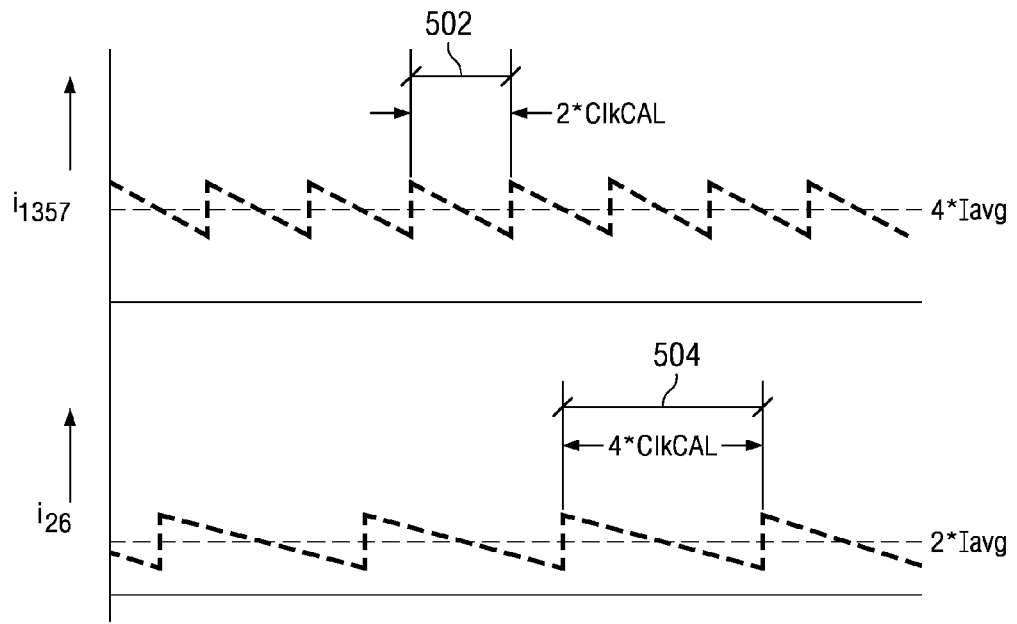
FIG. 5 is a graph illustrating the resultant outputs of the conventional current source configuration shown in FIG. 4.

FIG. 5 is a graph illustrating the resultant outputs of the conventional current source configuration 400 shown in FIG. 4. The top waveform represents the analog output resulting from the MSB b2 being in a logic high state (i.e., the sum of current sources 1, 3, 5 and 7). The lower waveform represents the analog output resulting from the mid-level bit b1 being in a logic high state (i.e., the sum of current sources 2 and 6). As shown in the top waveform of FIG. 5, the current level of the MSB b2 (i.e., the sum of current sources 1, 3, 5, and 7) is not constant due to the leakage current associated with the transistors of the current sources 1, 3, 5 and 7. Further, the current level corresponding to the MSB b2 experiences a correction every second calibration clock cycle ClkCAL, shown at reference numeral 502. The sum of the current sources 1, 3, 5, and 7 is approximately 4*Iavg+Iripple, because four substantially identical current sources are summed to yield the output for the MSB b2. Iripple is the current error signal due to the leakage and correction. Similarly, as shown in the bottom waveform of FIG. 5, the current level of the bit b1 (i.e., the sum of current sources 2 and 6,) also exhibits fluctuations due to leakage current. The current level of the current sources 2 and 6 is corrected every fourth calibration clock cycle, shown at reference numeral 504. The sum of the current sources 2 and 6 is approximately 2*Iavg+Iripple, because two substantially identical current sources are summed to yield the output for the bit b1.

More detailed descriptions of the conventional current source configuration 400 of FIG. 4 and the current levels of FIG. 5 are provided by Groeneveld, et al. in U.S. Pat. No. 5,021,784, the entirety of which is hereby incorporated by reference.

Figure 6:
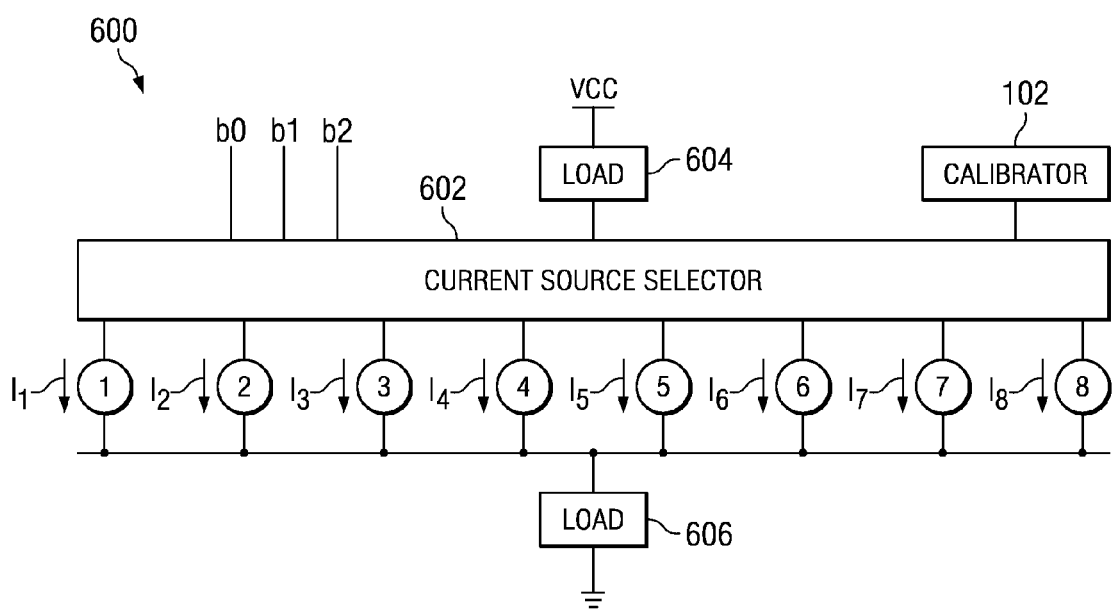
FIG. 6 is a block diagram of an example calibrated current source configuration to substantially reduce or cancel ripple in a digital to analog converter.

FIG. 6 is a block diagram of an example calibrated current source configuration 600 to substantially reduce or cancel ripple in a DAC. The example calibrated source signal 600 receives a digital input code, (e.g., bits b0, b1, and b2), and generates an appropriate analog output current signal corresponding to the digital input code. The digital input code may include any number N of bits, depending on the type of DAC. A calibrator 102 is selectively coupled to a number of current sources 1-8. The current sources 1-8 may be identical to, substantially identical to, or different than the current sources 1, 2, through N+1 of FIGS. 1 and 2 and/or the current sources 1-8 of FIG. 4.

The digital input code may be a binary-weighted input code, a thermometric input code, or any other appropriate type of digital code. A binary-weighted input code, as used herein, refers to a digital code in which each additional bit increases in weight by a factor of two. A thermometric input code, as used herein and described in more detail below, refers to a digital code in which every bit is equally weighted, and increasing the numerical value of the code requires toggling the next bit of the code. An example modified thermometric input code is described in FIG. 9 below. Typically, $2^x-1$ current sources (e.g., 15 current sources for a 4-bit input code) are employed to produce the desired precision in analog current levels in response to a binary-weighted code having x bits. However, a substitute current source is also included, and the calibrator 102 is selectively coupled to each of the current sources 1-8, one at a time, to adjust the current levels of the current sources 1-8 to track a reference current. The order in which the current sources are calibrated is referred to herein as the calibration sequence.

The calibration sequence establishes an order for calibrating the current sources 1-8. In the illustrated example, the calibration sequence is such that the current source 1 is calibrated first, followed by the current source 2, the current source 3, and so on through the substitute current source 8. The calibration sequence is circular in that, upon completion of the calibration of the last current source (e.g., current source 8), the calibrator 102 again calibrates current source 1. The calibration sequence continues to run in this circular fashion as long as the DAC is powered. The calibrator 102 of the illustrated example calibrates each current source 1-8 over one or more calibration clock cycles (e.g., ClkCAL).

The example calibrated current source configuration 600 of FIG. 6 includes a current source selector 602. The current source selector 602 determines the current source 1-8 that is to be calibrated at any given time. The current source undergoing calibration at a given time is referred to herein as the offline current source. The current sources that are not currently undergoing calibration are referred to herein as the active current sources. The current source selector 602 of the illustrated example dynamically assigns the active current sources (e.g., seven of current sources 1-8) to the bits b0-b2 of the digital input code. For example, the current source selector 602 assigns one of the active current sources (e.g., current source 5) to be responsive to the LSB b0, assigns two of the active current sources (e.g., current sources 3 and 7) to be responsive to the mid-level bit b1, and assigns the four remaining active current sources to be responsive to the MSB b2. As explained in the following, the current source selector 602 assigns the current sources to bits in a manner to reduce the ripple current discussed above. Further, the current source selector 602 of the illustrated example changes the bit-to-current source assignment with every calibration clock cycle. By changing the bit-to-current source assignment, the current source selector 602 reduces ripple in the output current.

Based on the digital input code and the current source 2-8 assignments, the appropriate current sources 2-8 sink current from a load 604 and/or source current to a load 606. The sourced and/or sunk current are summed to form an analog output signal that represents the digital input code to a precision corresponding to the number of input bits b0-b2.

Figure 7:
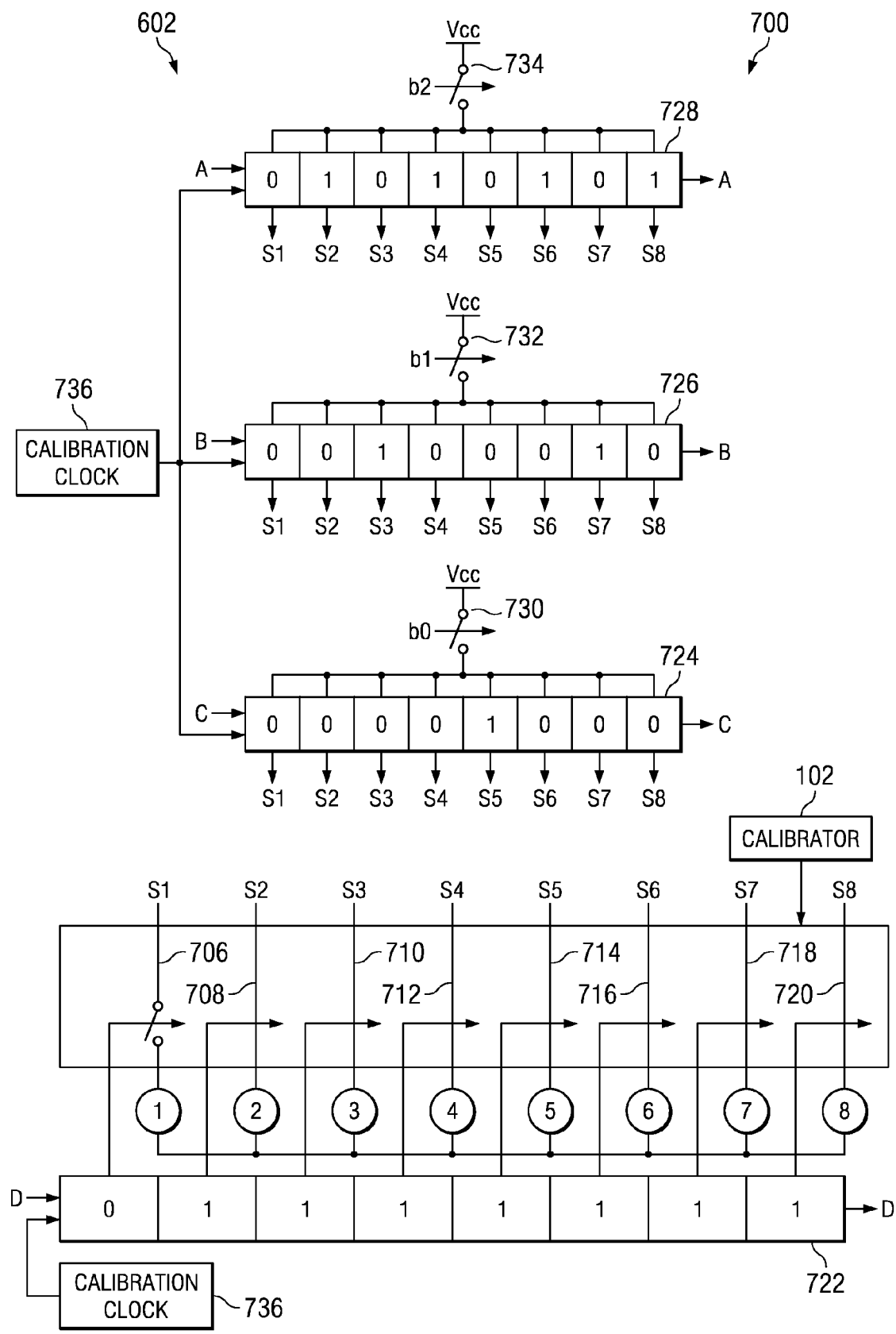
FIG. 7 is a block diagram of an example calibrated current source configuration to substantially reduce or cancel ripple in a digital-to-analog converter for a binary-weighted digital input code.

FIG. 7 is a block diagram of an example calibrated current source configuration 700 to substantially reduce or cancel ripple in a digital-to-analog converter (DAC) for a binary-weighted digital input code. The calibrated current source configuration 700 may be used to generate an analog current representative of the binary-weighted digital input code. In the example of FIG. 7, the digital input code includes a three-bit input code, where the LSB is labeled b0, the MSB is labeled b2, and the intermediate bit is labeled b1.

In the illustrated example, to represent a three-bit binary-weighted input code, seven ($2^x-1$, where x equals the number of binary bits to be converted) current sources 1-7 are required. A substitute current source 8 is included to allow the calibrated current source configuration 700 to operate while a calibrator 102 calibrates one of the current sources 1-8. As noted above, the current sources are calibrated one at a time in accordance with a calibration sequence. The current source selector 602 determines which of the current sources 1-8 is coupled to the calibrator 102 for calibration at any given time. The current source selector 602 includes several switches 706-720 corresponding to the current sources 1-8. The example switches 706-720 are controlled by a calibration shift register 722. The calibration shift register 722 maintains one of the example switches in the open position at any given time, and the calibrator 102 calibrates the current source corresponding to the open switch 706.

The example current source selector 602 further determines which of the switches 706-720 and, thus, which current sources 1-8 are responsive to the respective bits of the example three-bit input code. To make these bit-to-current source assignments, the current source selector 602 of the illustrated example includes three shift registers 724, 726, and 728. Each of the shift registers 724, 726 and 728 corresponds to a respective one of the LSB b0, the bit b1, and the MSB b2. The bit-to-current source assignments are determined in view of the calibration sequence and, thus, ensure that the current source 1-8 currently being calibrated is not mistakenly selected as an active current source. In the illustrated example, new bit-to-current source assignments are made every calibration clock cycle. Thus, the calibration shift register 722 and the bit assignment registers 724, 726, 728 are clocked together.

The example switches 706-720, the example calibration shift register 722, and the bit assignment registers 724, 726, 728, as illustrated in the example of FIG. 7, are shown having states at an example moment in time t=0. In the illustrated example, there are eight current sources and, thus, each of the bit assignment shift registers 724, 726 and 728 includes 8 register locations, one for each possible current source. The register locations of the bit assignment shift registers 724, 726, 728 are populated with logic values that determine which current sources are to be selected when the corresponding bit (e.g., b0, b1, b2) is a logic high (i.e., with the bit-to-current source assignments). As shown in FIG. 7, the bit assignment shift register 724 corresponds to the LSB b0 and, thus, has only one register location set to logic high at any given time because, in this example, a logic high of the LSB b0 is only to cause one current source to contribute to the analog output signal. Similarly, the bit assignment shift register 726 corresponds to the mid-level bit b1 and, thus, has two register locations set to logic high at any given time because, in this example, a logic high of the mid-level bit b1 is to cause two current sources to contribute to the analog output signal. The bit assignment shift register 728 corresponds to the MSB bit b2 and, thus, has four register locations set to logic high at any given time because, in this example, a logic high of the MSB b2 is to cause four current sources to contribute to the analog output signal. Significantly, the logic bit locations of the bit assignment shift registers 724, 726, 728 are selected such that an exclusive OR (XOR) operation performed on the aligned register locations of those bit assignment registers 724, 726, 728 would result in seven logic highs and one logic zero at any given time. As a result, only one of the three bit assignment registers 724, 726, 728 includes a logic high for any given switch S1-S8 at any given time. In the illustrated example, the register locations in all three bit assignment registers 724, 726, 728 that align with the calibration current source (i.e., the non-active current source that is undergoing calibration) are all set to logic zero.

The example calibration and bit assignment registers 722, 724, 726, 728 operate in a circular fashion as represented by the exit and entry arrows (labeled A, B, C and D) in FIG. 7. As also shown in FIG. 7, a calibration clock 736 cycles shifts the calibration and bit assignment registers 722, 724, 726 and 728 on each clock pulse to ensure the calibration sequence and the bit-to-current source assignments remain in synchronization.

Figure 8A:
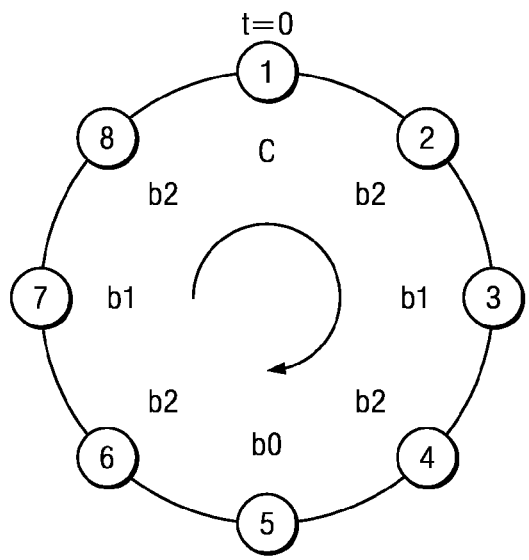
FIGS. 8A-8D illustrate an example calibration sequence and an example bit-to-current source assignment sequence for the example calibrated current source configuration illustrated in FIG. 7.
Figure 16:
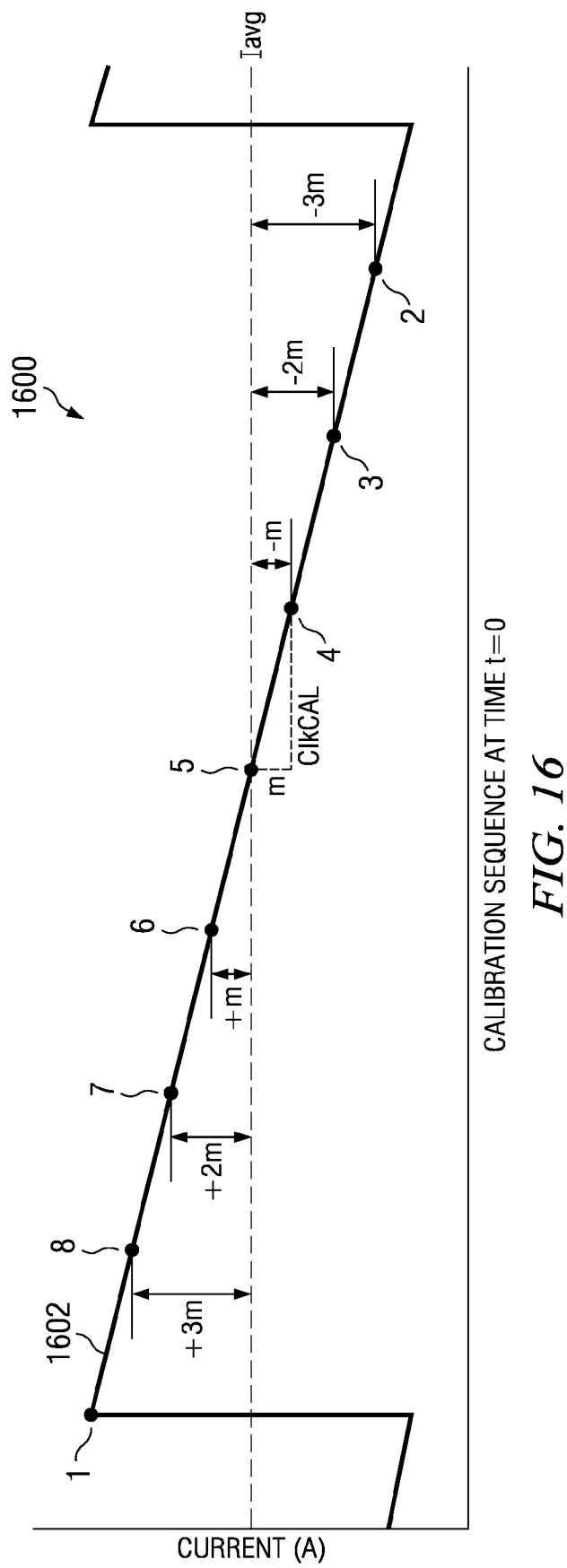
FIG. 16 is a graph illustrating current errors at a moment during an example calibration sequence.

FIG. 16 is a graph 1600 illustrating relative errors in current at a time t=0 corresponding to FIG. 8A (described below) of the example calibration sequence. A waveform 1602 illustrates the current error experienced by the current sources 1-8. The errors exhibited by the current sources 1-8 are spaced substantially equally on the waveform 1602 in accordance with the phase differences between the current sources. For example, when current source 1 is calibrated as shown in FIG. 8A, the current on current source 1 is increased to the maximum current value. The current source 8 was most recently calibrated (e.g., at the end of the last calibration sequence) and has suffered the least leakage. The current source 7 was next most recently calibrated and has the next highest current, followed by the current source 6. The amounts of leakage continue to increase in numerically descending order to the current source 2, which was least recently calibrated.

In the example of FIG. 16, the currents flowing through the sources 1-8 decrease linearly and equally at a rate of "m" Amperes (A)/calibration clock cycle ClkCAL. The waveform 1602 has an average value Iavg, and each current source 1-8 has an average current Iavg due to the linear decrease in current. In the example of FIG. 7, which includes eight current sources, a current source will decrease to Iavg after a time 4*ClkCAL. Where each current source 1-8 is calibrated for one clock cycle, the current source 8 has decreased from its maximum current by m*ClkCAL (A). The current source 7 has decreased from its maximum current by 2m*ClkCAL (A), and so on to the current source 2, which has decreased by 7m*ClkCAL (A).

The difference (−m) between the current in source 4 and Iavg is 4m*ClkCAL−5m*ClkCAL=−1m*ClkCAL. Using a similar method, the difference (+m) between the current in source 6 and Iavg is +1m*ClkCAL. Because current sources 4 and 6 have equal but opposite current differences (e.g., −m and +m) from Iavg at the instant in time shown in FIG. 16, summing the current sources 4 and 6 yields 2*Iavg. Therefore, the current differences from Iavg (i.e., current source errors) can be substantially reduced or canceled by combining pairs of current sources that vary from Iavg by substantially the same amounts. In the example graph 1600, these pairs include current sources 4 and 6, 3 and 7, and 2 and 8. The current source 5 is already substantially equal to Iavg and need not be averaged. The current source 1 is being calibrated and does not contribute to the analog output. While FIG. 16 illustrates one particular moment at time t=0, the example is applied during the calibration of other current sources 2-8 by shifting the current sources along the waveform appropriately.

Figure 8B:
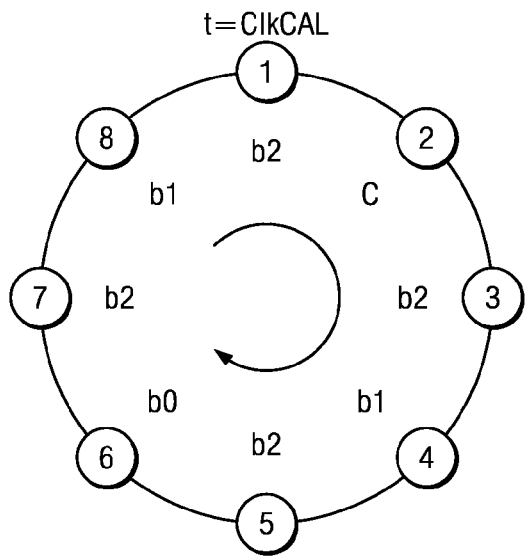
Figure 8C:
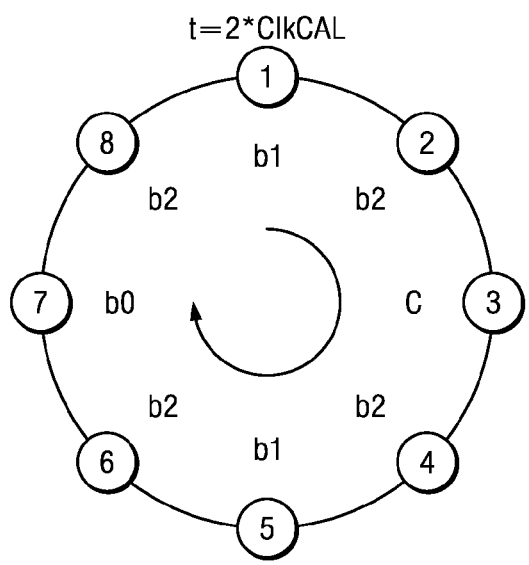
Figure 8D:
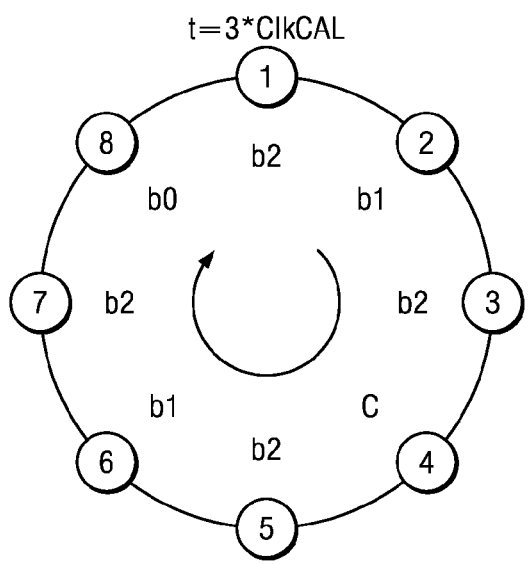

FIGS. 8A-8D illustrate an example calibration sequence and an example bit-to-current source assignment pattern for the example calibrated current source configuration 700. The current sources 1-8 are arranged in a circular calibration pattern. In the example of FIG. 8A (i.e., time t=0), current source 1 is being calibrated as represented by the notation "C" under the circled 1 representing current source 1 at the top of the figure. In the examples of FIGS. 8A-8D, each current source 1-8 is calibrated for one calibration clock cycle Clk-CAL. Thus, after one calibration clock cycle ClkCAL, the calibration of current source 1 is complete and current source 2 is under calibration as represented by the notation "C" adjacent the circled 2 representing current source 2 in FIG. 8B. This sequence is repeated each calibration clock cycle as represented in FIGS. 8C and 8D. Thus, for example, after a second calibration clock cycle ClkCAL, the calibration of current source 2 is complete and current source 3 is under calibration as represented by the notation "C" adjacent the circled 3 representing current source 3 in FIG. 8C. Similarly, after a third calibration clock cycle ClkCAL, the calibration of current source 3 is complete and current source 4 is under calibration as represented by the notation "C" adjacent the circled 4 representing current source 4 in FIG. 8D. As can be seen from the foregoing, the calibration sequence moves in a clockwise sequence once per calibration cycle so that each current source is calibrated once every eight calibration clock cycles.

The bit-to-current source assignments are selected in order to reduce or eliminate the ripple error signal from the analog output of the DAC. In other words, as illustrated in FIGS. 8A-8D, the bit-to-current source assignments are arranged in view of the relative phases of the error signals. The bit-to-current source assignments are shown in FIGS. 8A-8D by placing the bit notations b2, b1, b0 adjacent the current sources assigned to those bits. The notational conventions used in describing the proceedings figures are also used in FIGS. 8A-8D. Thus, b0 represents the LSB. B1 represents the mid-level bit of the three bit code. B2 represents the MSB.

As shown in FIGS. 8A-8D, current sources having an approximately 180° phase offset are shown on opposite sides of the calibration sequence. For example, the current sources 1 and 5 of FIG. 8A have a 180° phase offset. Similarly, current sources 2 and 6, 3 and 7, and 4 and 8, respectively, have 180° phase offsets. The calibration sequence remains the same throughout FIGS. 8A-8D, but turns counterclockwise on every calibration clock cycle. As shown in FIG. 8A, the two current sources assigned to the mid level bit b1 are equally offset from (i.e., spaced in symmetrical positions to) the current source 1 being calibrated. Similarly, the two pairs of current sources 2 and 8, and 4 and 6, assigned to the MSB b2 are equally offset from the current source 1 that is currently being calibrated. Finally, the current source assigned to the LSB b0 is located 180° from the current source undergoing calibration. These bit-to-current source assignments rotate clockwise in FIGS. 8A-8D on every calibration clock cycle. Since the calibration sequence rotates with this same direction and periodicity, the above described relationships are maintained even though the bit-to-current source assignments and the current source undergoing calibration change on every cycle.

In FIG. 8A, the current source 1 is coupled to the calibrator 102 for calibration at time t=0. The current source 5 has a 180° phase offset relative to the current source 1, which causes the current source 5 to have a current level approximately at Iavg. The current source selector 602 assigns the current source 5 to be responsive to the LSB b0. Next, the current source selector 602 assigns two of the remaining current sources to be responsive to the binary-weighted bit b1. In order to cancel out the ripple of the current sources assigned to the bit b1, the current source selector 602 assigns current sources 3 and 7, which are equidistant from the LSB b0 according to the calibration sequence. Because the source 3 has a current located the same amount above Iavg as the current of source 7 is below Iavg, the variance in the currents of these two current sources will substantially cancel one another. As a result, the sum of the currents through the current sources 3 and 7 will be approximately 2*Iavg.

Similarly, the current source selector 602 assigns two pairs of current sources 2, 8 and 4, 6 to b2, where the members of both pairs of current sources 2, 8, and 4, 6 are equidistant from the current source 5 in the current state of the calibration sequence. As a result, the ripple currents of these pairs of current sources 2, 4, 6, 8 will substantially cancel one another. Consequently, the sum of the current sources 2, 4, 6, and 8 is approximately 4*Iavg. While the selection of current sources 2-8 was described above based on their positions relative to the LSB b0, the corresponding pairs of current sources 2, 8; 3, 5; and 4, 6 are also spaced equidistant relative to the calibrated current source 1 in FIG. 8A. This spacing is maintained throughout FIGS. 8A-8D.

As explained above in connection with FIG. 3, each current source 1-8 has a ripple error signal. Each current source 1-8 demonstrates the same or substantially the same error signal, but has a different phase relative to one calibration cycle (i.e., one repetition of the calibration sequence). For example, if the current source 1 is the first of the current sources to be calibrated in the calibration sequence, the current source 1 has a phase offset of 0°, the current source 2 has a phase offset of 45°, the current source 5 has a phase offset of 180°, and so on.

In FIG. 8B, at time t=ClkCAL the calibrator 102 is decoupled from the current source 1, and is coupled to the current source 2 in accordance with the calibration sequence. Thus, the current source selector 602 selects the current source 6 to be responsive to the LSB b0. Also, the current sources 4 and 8 are selected to be responsive to the bit b1, and the current sources 1, 3, 5, and 7 are selected to be responsive to the MSB b2.

Similarly, in FIG. 8C the calibrator 102 is decoupled from the current source 2 and is coupled to the current source 3 for calibration at time t=2*ClkCAL. The current source 7 is selected to be responsive to the LSB b0, the current sources 1 and 5 are selected to be responsive to the bit b1, and the current sources 2, 4, 6, and 8 are selected to be responsive to the MSB b2.

In FIG. 8D, at time t=3*ClkCAL the calibrator 102 is decoupled from the current source 3 and is coupled to the current source 4 for calibration. Thus, the current source 8 is selected to be responsive to the LSB b0, the current sources 2 and 6 are selected to be responsive to the bit b1, and the current sources 1, 3, 5, and 7 are selected to be responsive to the MSB b2. The calibration sequence continues until the current source selector 602 selects the current source 8 for calibration, and then iterates to the example state shown in FIG. 8A.

Returning to FIG. 7, the example bit assignment shift register 724 determines which current source 1-8 is responsive to the LSB b0. The LSB b0, when logic high, is represented at the output of the calibrated current source configuration 700 by one of the current sources 1-8 and, thus, the bit assignment shift register 724 uses one output of the eight total outputs of the bit assignment shift register 724 to enable one current source (e.g., current source 5 in FIG. 7). While the bit assignment shift register 724 determines which current source is responsive to the LSB b0, a switch 730 is responsive to the LSB b0 and determines whether the current source selected by the bit assignment shift register 724 will be coupled to the analog output. The switch 730 can thus be thought of as being logically AND'ed with each of the register locations of the bit assignment shift register 724 to determine which, if any, of the current sources will contribute to the analog output of the DAC.

A second bit assignment shift register 726 determines which current sources 1-8 are responsive to the bit b1. In a binary-weighted digital input code, the bit b1 is represented by two of the current sources 1-8. In the example of FIG. 7, the bit assignment shift register 726 selects current source 3 and current source 7 to correspond to bit b1. As explained in connection with FIGS. 8A and 8B, the currents of sources 3 and 7 are lesser than Iavg and greater than Iavg, respectively, by substantially the same amount and, thus, summing their respective rippled currents will substantially cancel out any error. While the bit assignment shift register 726 determines which two current sources are responsive to the mid-level bit b1, a switch 732 is responsive to the mid-level bit b1 to determine whether the current sources selected by the bit assignment shift register 726 will be coupled to the analog output. The switch 732 can thus be thought of as being logically AND'ed with each of the register locations of the bit assignment shift register 726 to determine which, if any, of the current sources will contribute to the analog output of the DAC.

A third bit assignment shift register 728 determines which current sources 1-8 are responsive to the MSB b2. In a binary-weighted digital input code, the MSB b2 is represented by four of the current sources 1-8. In the example of FIG. 7, the bit assignment shift register 728 selects four current sources 2, 4, 6, and 8 to correspond to bit b2. As explained in connection with FIGS. 8A and 8B, the currents of sources 2 and 8 are lesser than Iavg and greater than Iavg, respectively, by substantially the same amount and, thus, their respective rippled currents will substantially cancel out any error. Similarly, the currents of sources 4 and 6 are lesser than Iavg and greater than Iavg, respectively, by substantially the same amount and, thus, their respective rippled currents will substantially cancel out any error. While the bit assignment shift register 728 determines which four current sources are responsive to the MSB b2, a switch 734 is responsive to the MSB b2 to determine whether the current sources selected by the bit assignment shift register 728 will be coupled to the analog output. The switch 734 can thus be thought of as being logically AND'ed with each of the register locations of the bit assignment shift register 728 to determine which, if any, of the current sources will contribute to the analog output of the DAC.

The states of the switches 730, 732, 734 are summed together with the states of their respective bit assignment shift registers 724-728 and output via outputs S1-S8. The outputs S1-S8 represent a sum of the corresponding outputs of all three bit assignment shift registers 724-728. For example, the leftmost bits of the bit assignment shift registers 724-728 output as signals S1 (as modified based on the states of their respective switches 730-734) are summed to control whether the current source 1 will contribute to the analog output of the DAC. Additionally, the bit assignment shift registers 724-728 carry over a serial output to a serial input. For example, the bit assignment shift register 728 serially outputs the rightmost bit to the serial input at the leftmost bit of the bit assignment shift register 728 in response to a calibration clock 736.

The calibration clock 736 controls the calibration time of the current sources 1-8. The calibration clock 736 and the calibration and bit assignment shift registers 722-728 illustrate a configuration where each current source 1-8 is calibrated for one calibration clock cycle ClkCAL. However, it should be recognized that other logic/timing configurations allowing multiple clock cycles are possible.

The calibration and bit assignment shift registers 722-728 may receive appropriate serial or parallel inputs when the calibrated current source 700 begins operation. To this end, a memory or logic device may assign an initial state to each of the calibration and bit assignment shift registers 722-728. An example state is illustrated in FIG. 7, wherein the calibration shift register 722 includes one bit set to zero, and the remaining bits set to one. The bit assignment shift registers 724, 726, and 728 are populated with initial states to reflect the assignment of the current sources 2-8 to a digital input code in a manner that substantially reduces or eliminates the ripple error and that recognizes the current source 1 as being in the first calibration state.

During the initial state illustrated in FIG. 7, we will assume for purposes of discussion that a three-bit code '101' is input to the calibrated current source 700, where b0 is 1, b1 is 0, and b2 is 1. Thus, the switches 730 and 734 are closed in response to the logical ones at b0 and b2, and the switch 732 is open in response to the logical zero at b1. The bit assignment shift register 724 outputs a high logic value through the output corresponding to the register locations containing logical ones (e.g., S5), to the current source 5. Similarly, the bit assignment shift register 728 outputs logic highs through the outputs S2, S4, S6, and S8 corresponding to the register location containing a logical one stored in the bit assignment shift register 728. As a result, the currents of the current sources 2, 4, 5, 6, and 8 are added to the analog output of the DAC. The switch 732 is open in response to b1, and therefore the bit assignment shift register 726 outputs no logic highs regardless of the states of its register locations. As a result, approximately 5*Iavg current is conducted through the calibrated current source 700, which corresponds to the binary-weighted input code '101'. (See FIG. 14)

When the calibration clock 736 signals the next calibration clock cycle ClkCAL, each calibration shift register 722-728 shifts data to the right by one location, and the rightmost bits are serially reentered into the leftmost bits of the respective shift registers 722-728. As a result, the current source 2 is coupled to the calibrator 102 via the current source selector 602, and the current sources 1 and 3-8 are reselected to be responsive to the digital input codes.

The example calibrated current source configuration 700 of FIG. 7 is scalable to input codes having different numbers of bits than those discussed above. In examples involving more bits, more current sources and larger shift registers are required. A current source will be selected to be responsive to the bit b0, where the current source responsive to the bit b0 has approximately a 180° error signal phase offset relative to the calibrated current source and/or that has an output current of approximately Iavg at the moment of selection. The remaining current sources will be paired in an attempt to cancel out or reduce the ripple currents.

Figure 9:
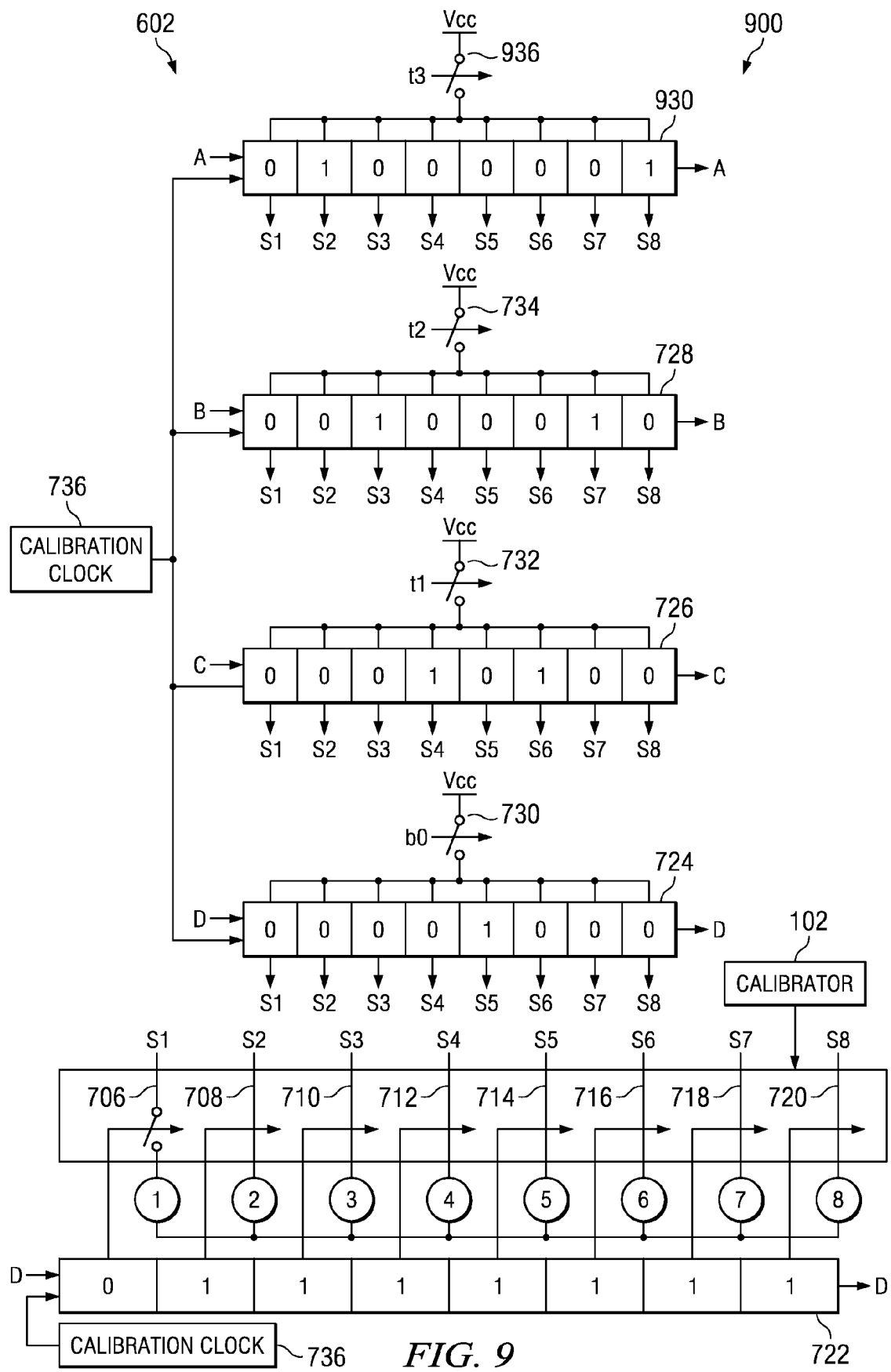
FIG. 9 is a block diagram of an example calibrated current source configuration to substantially reduce or cancel ripple in a digital-to-analog converter for a thermometric digital input code.

FIG. 9 is a block diagram of an example calibrated current source configuration 900 to substantially reduce or cancel ripple in a DAC for a thermometric digital input code. The example calibrated current source configuration 900 includes a calibrator 102, a current source selector 602, and several current sources 1-8. The calibrator 102 is substantially identical to the calibrator 102 of FIG. 7, and the current sources 1-8 are substantially identical to the current sources 106-112 of FIG. 2, the current sources 1-8 of FIG. 4, and/or the example current sources 1-8 of FIG. 7. The current source selector 602 also includes switches 706-720 that are substantially the same as the switches 706-720 of FIG. 7.

In contrast to the binary-weighted code received by the example calibrated current source configuration 700 of FIG. 7, the calibrated current source configuration 900 receives a thermometric digital input code, in which each bit except for the LSB b0 is equally weighted. A modified thermometric code is used in FIG. 9, which uses a least significant bit b0, and multiple thermometric bits t1, t2, and t3. The thermometric bits t1-t3 are equally weighted, and the least significant bit b0 carries one-half the weight of the thermometric bits t1-t3. The example modified thermometric code used herein is more bitwise efficient than a standard thermometric code. The LSB b0 requires one current source to be accurately represented, and bits t1, t2, and t3 each require two current sources to be represented. Thus, to control seven current sources to represent eight possible signal levels, a thermometric input code requires four bits instead of the eight bits required by a standard thermometric code. In general, a standard thermometric code representing N values would require $2^N-1$ bits (e.g., current sources). However, the example modified thermometric code used in FIGS. 9 and 10A-10D requires $2^{N-1}+1$ bits to represent the same number N of values. A table of output values for the modified thermometric code referred to herein is illustrated in FIG. 15. The example current source selector 602 of FIG. 9 includes one calibration shift register 722 to determine the current source 1-8 to be calibrated and four bit assignment shift registers 724, 726, 728, and 930 to select and assign current sources 1-8 to be responsive to the bits b0 and t1-t3 of the digital input code. Switches 730, 732, 734, and 936 are responsive to the respective bits b0, t1, t2, and t3 in a manner similar to the switches 730, 732, and 734 of FIG. 7.

Figure 10A:
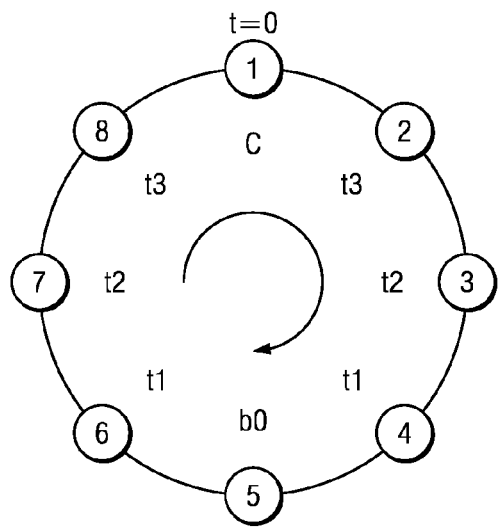
FIGS. 10A-10D illustrate an example calibration sequence for the example calibrated current source configuration illustrated in FIG. 9.
Figure 10B:
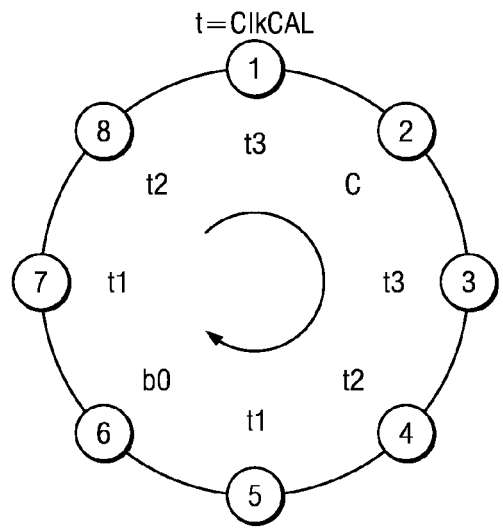
Figure 10C:
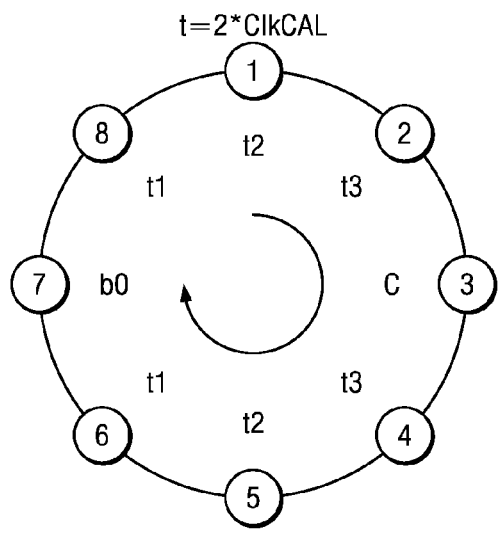
Figure 10D:
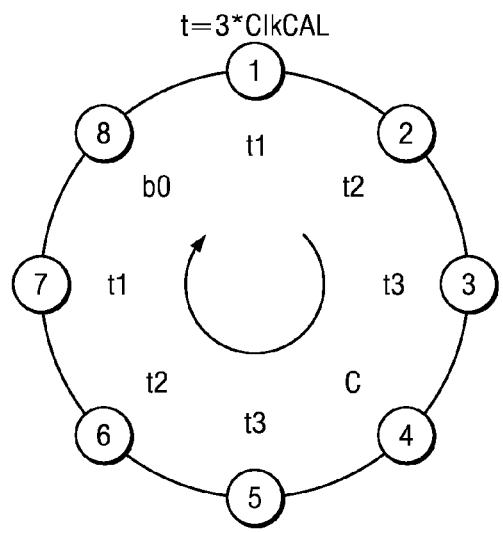

FIGS. 10A-10D illustrate an example calibration sequence and an example bit-to-current source assignment pattern for the example calibrated current source 900. The current sources 1-8 are arranged in a circular calibration sequence. In the example of FIG. 10A (i.e., time t=0), current source 1 is being calibrated as represented by the notation "C" under the circled 1 representing current source 1 at the top of the figure. In the examples of FIGS. 10A-10D, each current source 1-8 is calibrated for one calibration clock cycle ClkCAL. Thus, after one calibration clock cycle ClkCAL, the calibration of current source 1 is complete and current source 2 is under calibration as represented by the notation "C" adjacent the circled 2 representing current source 2 in FIG. 10B. This sequence is repeated each calibration clock cycle as represented in FIGS. 10C and 10D. Thus, for example, after a second calibration clock cycle ClkCAL, the calibration of current source 2 is complete and current source 3 is under calibration as represented by the notation "C" adjacent the circled 3 representing current source 3 in FIG. 10C. Similarly, after a third calibration clock cycle ClkCAL, the calibration of current source 3 is complete and current source 4 is under calibration as represented by the notation "C" adjacent the circled 4 representing current source 4 in FIG. 10D. As can be seen from the foregoing, the calibration sequence moves in a clockwise sequence continuously so that each current source is calibrated once every eight calibration clock cycles.

As mentioned above in FIGS. 8A-8D, each of the current sources 1-8 of FIGS. 10A-10D generates an undesirable ripple error signal. Each current source 1-8 also demonstrates the same or substantially the same error signal, but each error signal has a different phase relative to the other error signals. The description of FIG. 16 also applies to the example time t=0 of FIG. 10A. If, for example, the calibration sequence starts at the current source 1, the current source 1 can be defined to have no phase offset, the current source 2 has a phase offset of 45° relative to current source 1, the current source 5 has a phase offset of 180° relative to current source 1, and so on. Each current source 1-8 of FIG. 9 is calibrated during a single, respective calibration clock cycle ClkCAL.

In FIG. 10A, at time t=0 the calibration shift register 722 selects the current source 1 for calibration. The bit assignment shift register 724 also selects current source 5, generates a current that is approximately equal to Iavg, to be responsive to the LSB b0 of the digital input signal. As in FIG. 8A, the bit-to-current source assignments are selected to assign pairs of current sources such that the corresponding pairs of currents average to Iavg to reduce and/or cancel ripple currents. Therefore, the LSB b0 will cause a change of Iavg in the output current. The bit assignment shift register 726 selects the current sources 4 and 6 to be responsive to the bit t1 because the summed currents of sources 4 and 6 have an average of approximately Iavg. In a manner similar to the bit assignment described in FIG. 7, the source 4 has a current error with respect to Iavg that is approximately equal and opposite to the current error of the source 6. Therefore, summing the current errors of the current sources 4 and 6 causes the error to be substantially reduced or canceled. Similarly, the bit assignment shift registers 728 and 930 select the remaining current sources 2, 3, 7, and 8 to be responsive to respective bits t2 and t3 such that the selected source pairs output currents that average to Iavg.

In FIG. 10B, at time t=ClkCAL the current source selector 602 decouples the current source 1 from the calibrator 102 and couples the current source 2 to the calibrator 102 for calibration. Also, the bit assignment shift register 724 selects the source 6 that outputs a current approximately equal to Iavg to be responsive to the LSB b0. The bit assignment shift registers 726, 728, and 930 then select the remaining current sources 1, 3-5, 7, and 8 to be responsive to the remaining respective bits.

In FIG. 10C the calibrator 102 is decoupled from the current source 2 and is coupled to the current source 3 for calibration at time t=2*ClkCAL. The current source 7 is selected to be responsive to the LSB b0, the current sources 6 and 8 are selected to be responsive to the bit t1, and the current sources 1 and 5, 2 and 4 are selected to be responsive to bits t2 and t3, respectively.

In FIG. 10D, at time t=3*ClkCAL the calibrator 102 is decoupled from the current source 3 and is coupled to the current source 4 for calibration. Thus, the current source 8 is selected to be responsive to the LSB b0, the current sources 1 and 7 are selected to be responsive to the bit t1, and the current sources 2 and 6, 3 and 5 are selected to be responsive to the bits t2 and t3, respectively. The calibration sequence continues. After the current source selector 602 selects the current source 8 for calibration, the calibration sequence returns to the example arrangement shown in FIG. 10A.

While some example current source configurations are illustrated in FIGS. 7 and 9, the examples may be modified to perform other methods of changing the bit-to-current source assignments. For example, the calibration sequence may change from calibration cycle to calibration cycle while balancing the current errors to reduce or eliminate the ripple. In some examples, the current source selector 602 of FIG. 9 selects current sources 4 and 6 to be responsive to the bit t1, current sources 3 and 7 to be responsive to the bit t2, and current sources 2 and 8 to be responsive to the bit t3 at time t=0. Then, at time t=ClkCAL, the current source selector 602 adjusts the bit-to-current source assignment and selects current sources 5 and 7 to be responsive to bit t2 (as opposed to t1 as illustrated in FIG. 10B), selects current sources 4 and 8 to be responsive to bit t3 (as opposed to t2 as illustrated in FIG. 10B), and selects current sources 1 and 3 to be responsive to bit t1 (as opposed to t3 as illustrated in FIG. 10B). Such an implementation may further reduce noise and/or error in the output current where the current source errors are not linear. Many other bit-to-current source assignments, schemes, and/or logical implementations are possible.

Additionally, the example current sources 1-8 of FIGS. 7-10 are numbered sequentially for ease of discussion. The calibration of the current sources 1-8 may, but is not required, to be the same from one calibration sequence to another. Further, calibration of the current sources may, but is not required, to be performed in numerical order (e.g., in accordance with the number assigned to the current sources 1-8).

Figure 11:
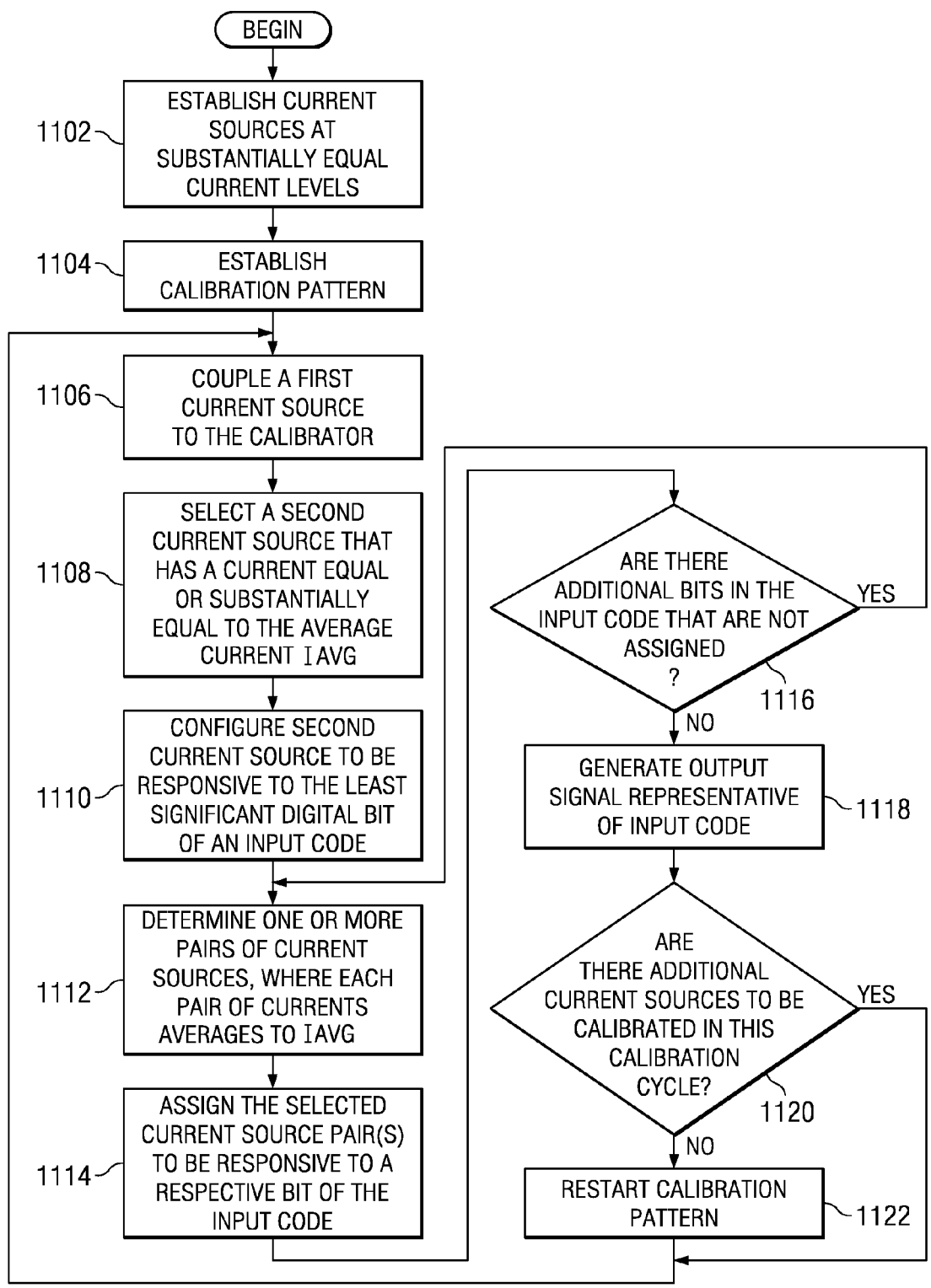
FIG. 11 is a flow diagram of an example method to calibrate a current source configuration.

FIG. 11 is a flow diagram of an example method 1100 to calibrate a current source. The example method 1100 may be used to implement the example calibrated current source configurations 700 or 900 of FIGS. 7 and 9. Additionally or alternatively, the example method 1100 may be implemented completely or partially in one or more programmable or non-programmable logic devices, such as programmable array logic (PALs), general array logic (GALs), field programmable gate arrays (FPGAs), application specific integrated circuits (ASICs), central processing units (CPUs), and/or any other type of logic device. For example, the calibration shift registers 722, the bit assignment shift registers 724-728 and/or 724-930, the switches 730-734 and/or 730-936, or more generally the current source selectors 602 of FIGS. 7 and 9, respectively, may be implemented using any one or more of the logic devices described above. The following description of the example method 1100 of FIG. 11 will refer to the calibrated current source configuration 700 of FIG. 7. However, it should be recognized that the description is equally applicable to the calibrated current source configuration 900 of FIG. 9 and to other implementations of the example method.

The example method 1100 begins by establishing multiple current sources (e.g., the current sources 1-8 of FIGS. 7 and 9) at substantially equal current levels (block 1102). As mentioned above, the current levels fluctuate, and each current source 1-8 has an error signal and an average current Iavg. The error signals and the average currents of each current source are similar. However, each error signal is out of phase from the error signals of adjacent current sources (wherein adjacent current sources are defined based on the order in which the current sources are calibrated). The current source selector 602 then establishes a calibration sequence (block 1104). The example calibration sequence of FIG. 7 is shown in FIGS. 8A-8D. The calibrator 102 calibrates the current sources 1-8 in numerical order (e.g., current source 1, current source 2, and so on to current source 8).

When the example calibrated current source configuration 700 is operating (e.g., receiving digital input codes and begins calibrating current sources), the current source selector 602 couples a first current source (e.g., current source 1) to the calibrator 102 (block 1106). The current source selector 602 selects a second current source (e.g., 5) that has a current equal or substantially equal to the average current Iavg (block 1108). The current source selector 602 (e.g., via the bit assignment shift register 724) configures the second current source 5 to be responsive to the LSB b0 of the input code (block 1110).

Once a current source has been selected and configured to be responsive to the LSB b0 (block 1110), the current source selector 602 selects one or more current source pairs (e.g., 4 and 6, 3 and 7, 2 and 8) where the currents of each selected current source pair average to Iavg (block 1112). This may be accomplished by, for example, counting an equal number of current sources in either direction on the calibration sequence (e.g., the calibration sequences shown in FIGS. 8A-8D and 10A-10D) from the calibrated current source 1. The current source selector 602 assigns the selected current source pair(s) to a respective bit (e.g., b1, b2) of the digital code (block 1114). The current source selector 602 then determines whether there are additional bits of the digital code remaining to be assigned (block 1116).

If there are bits remaining in the input code (block 1116), control returns to block 1112 to select additional current source pairs. If all the bits of the input code have been assigned respective current sources (block 1116), the calibrated current source generates an output signal representative of the digital input code (block 1118). One or more digital codes may be input to the calibrated current source 700 while the first current source is calibrated. The switching network then determines whether there are additional current sources 2-8 to be calibrated (block 1120). If there are additional current sources to be calibrated (block 1120), control returns to block 1106 to couple the next current source (e.g., 2) to the calibrator 102. If the calibration cycle is finished (block 1120), the switching network restarts the calibration sequence (block 1122) and control returns to block 1106 to couple the first current source in the calibration sequence to the calibrator 102. The example method 1100 is iterated while digital codes are input to the calibrated current source configuration 700.

In some examples, the calibration clock 736 is faster than a clock of the DAC in which the calibrated current source 700 is implemented. For example, the calibration clock 736 may be 32 times faster than the DAC clock, allowing four calibrations of each current source per 3-bit input code, one calibration of each current source per 5-bit input code, and/or one calibration of one-quarter of the current sources per 7-bit input code.

Figure 12A:
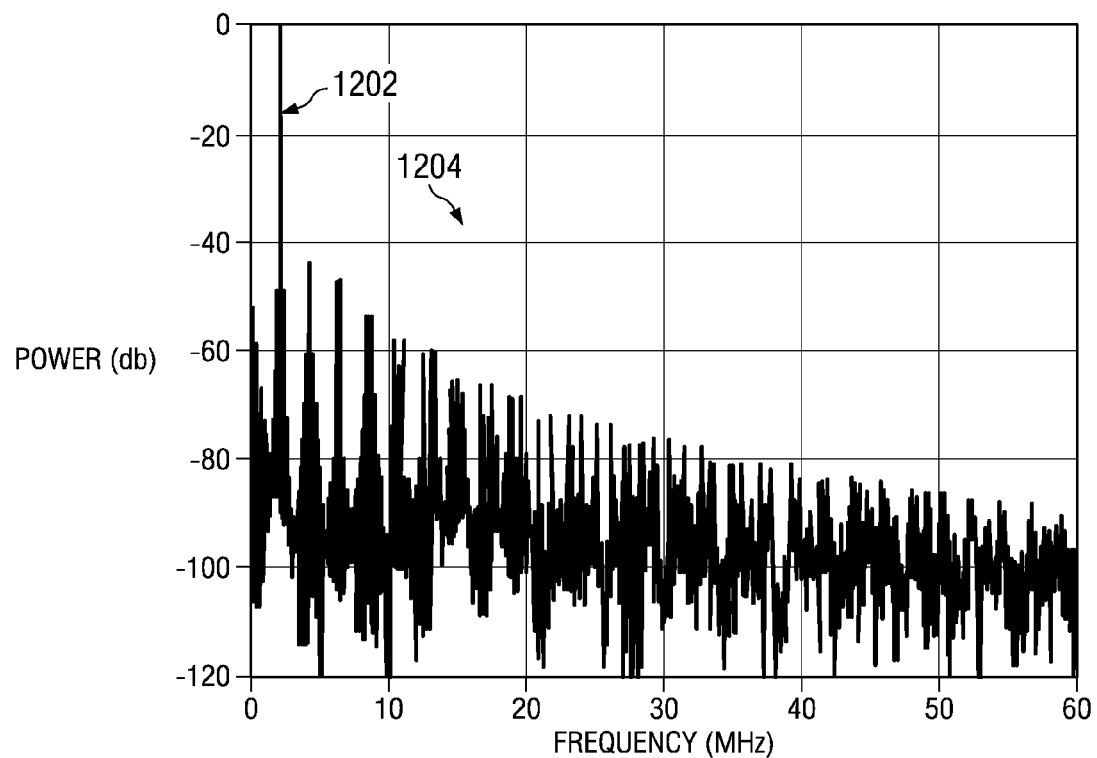
FIG. 12A is a graph illustrating the frequency response of the conventional current source configuration of FIG. 2.

FIG. 12A is a graph illustrating the frequency response of the conventional current source configuration 100 of FIG. 2. As shown in FIG. 12A, the output signal 1202 in the output of the DAC has errors or noise, which manifest as spurious signals 1204 that cause noise. Spurious noise also exists at the frequency of the calibration clock at approximately 15.6 megahertz (MHz).

Figure 12B:
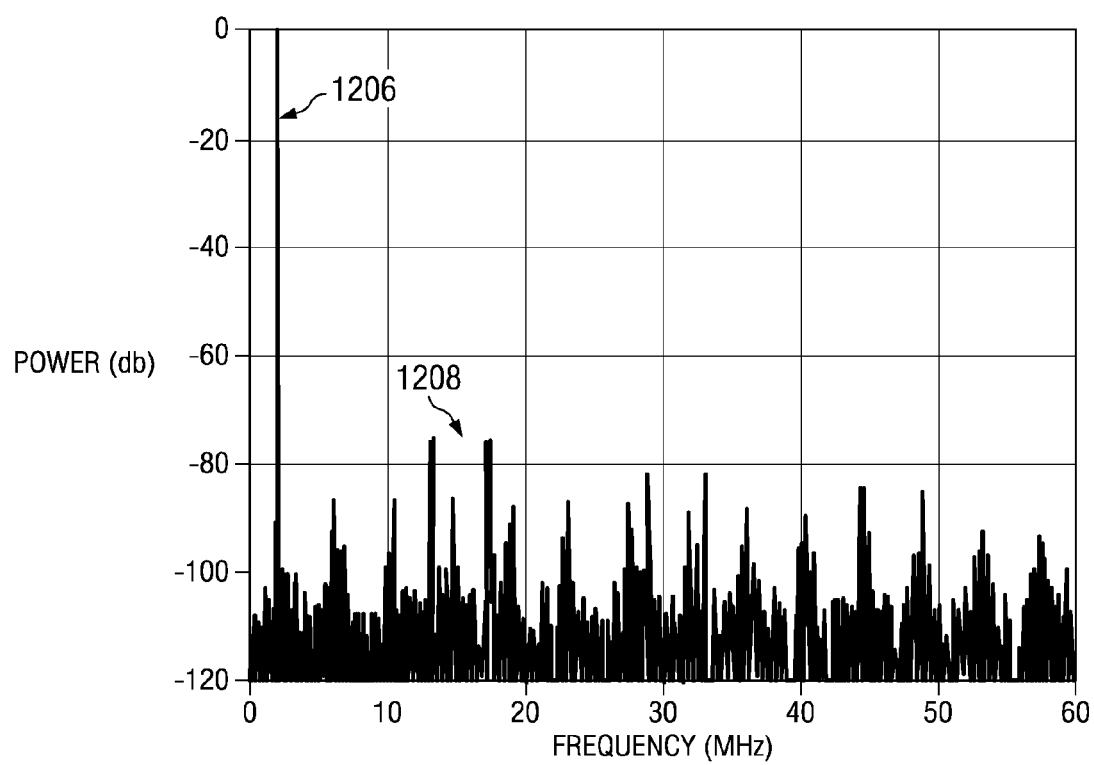
FIG. 12B is a graph illustrating an example frequency response of the example calibrated current source configuration of FIG. 7.

FIG. 12B is a graph illustrating an example frequency response of the example calibrated current source 700 of FIG. 7. As shown in FIG. 12B, the intended output signal 1206 in the output of the DAC has errors or noise as shown by the spurious signals 1208. The output signal retains a small gain (e.g., amplitude) error, which is constant and is not perceived as spurious noise. The gain error generally has a minimal or negligible effect on the output current. In contrast to the gain error, than the ripple noise of the conventional configurations can cause substantial interference and corrupt the frequency response. The additional spurious signals 1208 are due to current or signal drift within one calibration clock cycle, and appear as low-power tones (e.g., below −70 dB) at approximately 15.6 MHz+/−2.1 MHz.

The example frequency response of FIG. 12B is for one calibration clock cycle ClkCAL per current source. In some examples, the calibration clock cycle is longer (i.e., the calibration rate is slower) than the rate of incoming data. Thus, the current sources (e.g., 1-8) are calibrated for more than one calibration clock cycle. A multiple-clock-cycle calibration time will yield different frequency responses due to higher drift or ripple. The drift may manifest as a triangular wave at the calibration frequency and tones at multiples of the calibration frequency. To reduce the tones, the input digital signal can be pre-distorted prior to input to the example calibrated current source (e.g., the calibrated current sources 700 of FIG. 7 or 900 of FIG. 9). For example, a replica current source may be included to estimate the distortion, which is then used to digitally modify the input signal. Additionally or alternatively, the calibrated current source may be calibrated once at startup of the circuit to estimate the distortion. Once the estimate is complete, further input codes are digitally modified to eliminate the tones caused by the larger drift.

Figure 12C:
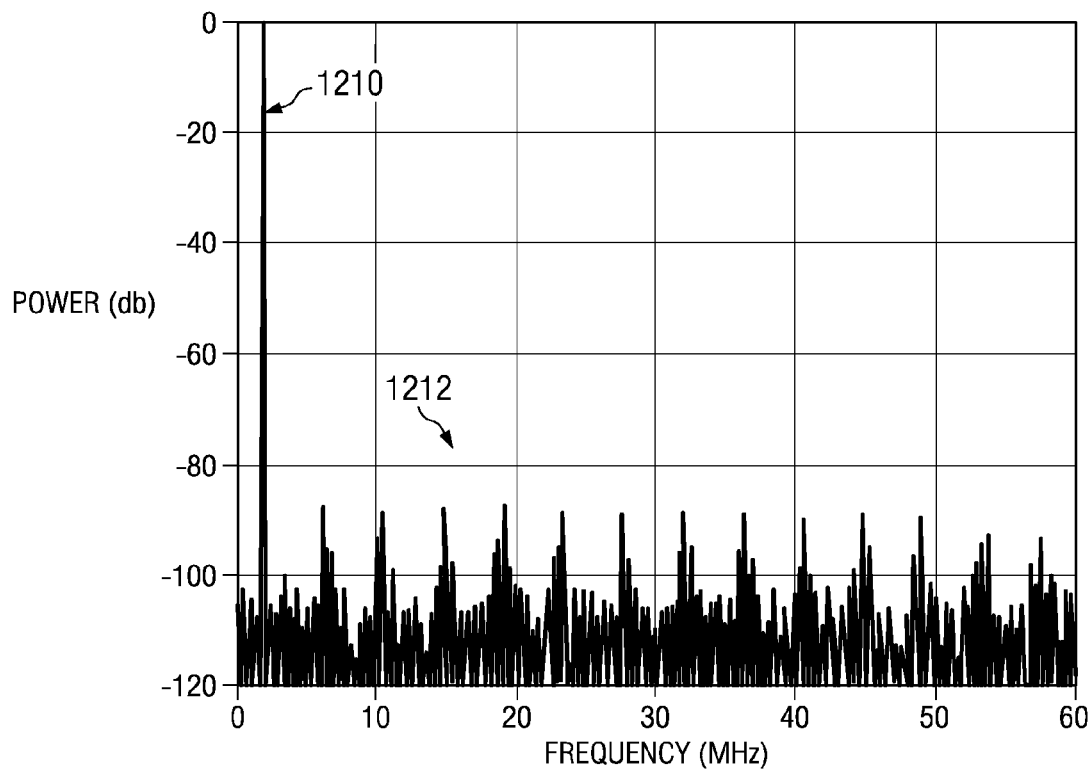
FIG. 12C is a graph illustrating an example frequency response using pre-distortion of the input codes based on estimation of distortion.

FIG. 12C is a graph illustrating an example frequency response using pre-distortion of the input codes based on estimation of distortion. A spurious signal 1210 at 2.1 MHz remains due to the calibration clock frequency, but the noise power is much lower than the solutions in FIGS. 12A and 12B. The noise power due to the calibration may even decrease below the noise floor.

Figure 13:
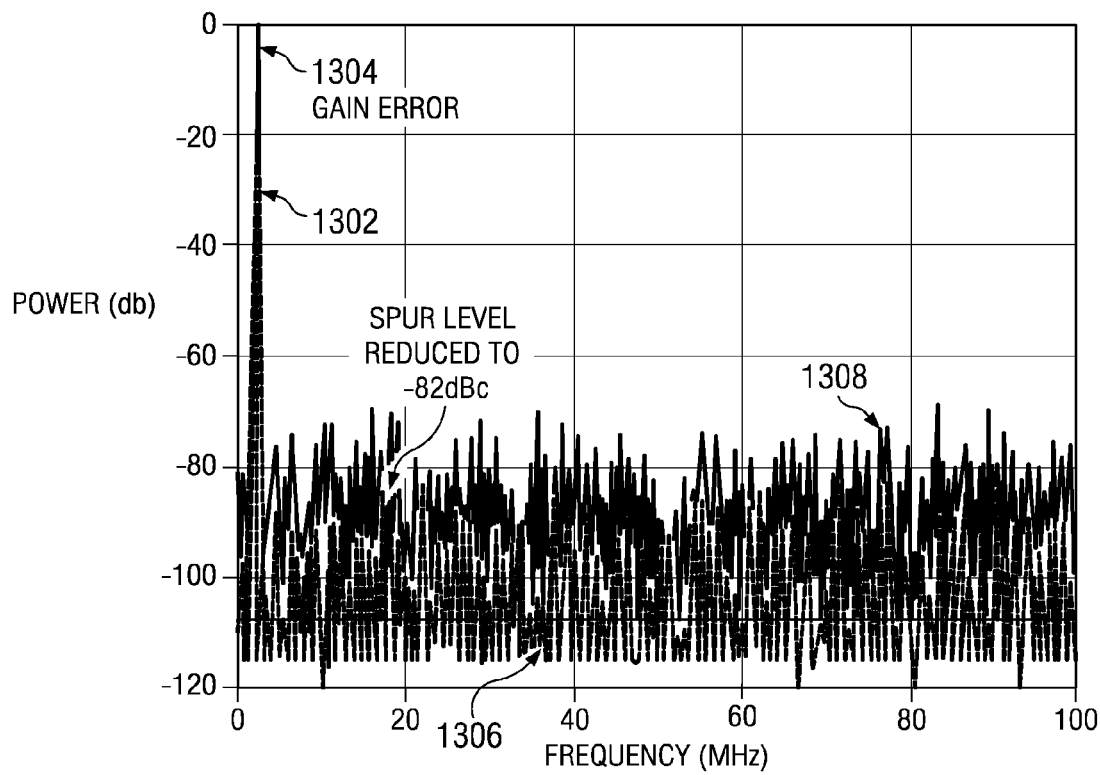
FIG. 13 is a graph comparing the frequency responses of the example conventional current source configuration of FIG. 4 and the example calibrated current source configuration of FIG. 9.

FIG. 13 is a graph comparing the frequency responses of the example conventional current source configuration 400 of FIG. 4 and the example calibrated current source configuration 900 of FIG. 9. As illustrated in FIG. 13, gain errors 1302 and 1304 illustrate minor changes that can be digitally corrected. The noise power 1306 of the calibrated current source configuration 900 is much less than the noise power 1308 of the conventional configuration. As a result, greater precision may be reached with the example calibrated current sources.

While some example logic is shown to implement the methods and apparatus described herein, many other implementations are applicable. Any combination of logic methodologies may be used to implement the methods and apparatus described herein. The advantages of some logical methods over others will be apparent, and the selection of the implementation will be dependent on the application.

Although certain example methods and apparatus are described herein, other implementations are possible. The scope of coverage of this patent is not limited to the specific examples described herein. On the contrary, this patent covers all methods and apparatus falling within the scope of the invention.

What is claimed is:

1. A digital to analog converter to convert digital bits into an analog output signal,
comprising:
a plurality of current sources configured to output substantially identical currents;
a calibrator selectively coupled to sequentially calibrate the plurality of current sources to a reference current; and
a current source selector configured to assign respective ones of the plurality of current sources to the digital bits in accordance with a bit-to-current source sequence selected to reduce current error in the analog output, and configured to change the assignments based on the current source coupled to the calibrator.

2. A digital to analog converter as defined in claim 1, wherein the current source selector comprises a plurality of shift registers, each of the shift registers configured to map a respective digital bit to a respective subset of the plurality of current sources in accordance with the bit-to-current source sequence.

3. A digital to analog converter as defined in claim 2, wherein each of the shift registers stores N logic values in respective register locations, and performing an exclusive-OR operation between the logic values in corresponding register locations of the shift registers results in N−1 values having a first logic state and one value having a second logic state different than the first logic state.

4. A digital to analog converter as defined in claim 2, wherein the shift registers are clocked in synchronicity with the calibration sequence.

5. A digital to analog converter as defined in claim 1, wherein the current source selector is configured to assign a pair of the current sources to a digital bit.

6. A digital to analog converter as defined in claim 5, wherein the pair of the current sources is selected such that summing their currents reduces the current error.

7. A digital to analog converter as defined in claim 5, wherein the one of the plurality of current sources having a current substantially equal to a desired average current is assigned to a least significant bit of the digital bits.

8. A digital to analog converter as defined in claim 1, wherein the current source selector comprises at least one of programmable array logic, general array logic, a field programmable gate array, an application specific integrated circuit, or a central processing unit.

9. A digital to analog converter as defined in claim 1, wherein the calibrator calibrates the current sources in accordance with a calibration sequence and the bit-to-current source sequence is synchronized with the calibration sequence.

10. A digital to analog converter as defined in claim 1, wherein the current source selector is configured to couple the calibrator to each of the plurality of current sources for a number of calibration clock cycles.

11. A digital to analog converter as defined in claim 1, wherein the digital bits correspond to a thermometric code or a weighted-binary code.

12. A method to convert digital bits into an analog output signal, comprising:
configuring a plurality of current sources to output substantially identical current levels;
selecting a first one of the current sources for calibration according to a calibration sequence; and
assigning respective ones of the plurality of current sources to the digital bits in accordance with a bit-to-current source sequence selected to reduce current error in the analog output, the bit-to-current source sequence being synchronized with the calibration sequence.

13. A method as defined in claim 12, further comprising:
selecting a second one of the current sources for calibration to a calibration sequence; and
changing the assignment of the plurality of current sources when the calibrator is coupled to the second one of the current sources.

14. A method as defined in claim 12, wherein assigning the respective ones of the current sources comprises selectively coupling the respective ones of the current sources to one or more shift registers corresponding to the digital bits.

15. A method as defined in claim 14, wherein each of the shift registers stores N logic values in respective register locations, and performing an exclusive OR operation between the logic values in corresponding register locations of the shift registers results in N−1 values having a first logic state and one value having a second logic state different than the first logic state.

16. A method as defined in claim 14, further comprising clocking the shift registers in synchronicity with the calibration sequence.

17. A method as defined in claim 12, wherein assigning comprises selecting pairs of the current sources such that summing their currents reduces the current error.

18. A method as defined in claim 17, further comprising assigning one of the current sources having a current substantially equal to a desired average current to a least significant digital bit.

19. A method as defined in claim 12, wherein changing the assignment of the plurality of current sources comprises changing the respective assignments of all of the current sources to the digital bits.

20. A digital-to-analog converter to convert digital bits into an analog output signal,
comprising:
a plurality of current sources, configured to output substantially identical current levels in response to respective bits of a digital input code, wherein the current levels vary due to leakage current and according to a calibration sequence;
a calibrator selectively coupled to the plurality of current sources, configured to adjust the current level of one of the current sources according to the calibration sequence;
a calibration shift register coupled to the calibrator, configured to selectively couple the calibrator to one of the current sources for one or more calibration clock cycles according to the calibration sequence; and
a current source selector, comprising a plurality of bit assignment shift registers coupled to the plurality of current sources, a first one of the bit assignment shift registers configured to:
select a second one of the current sources that has a current substantially equal to a desired average current;
configure the second current source to be responsive to a least significant bit of the digital input code based on the calibration sequence; and remaining respective ones of the bit assignment shift registers configured to:

select the remaining current sources by pairs to be responsive to respective remaining bits of the digital input code, wherein current sources responsive to the same bit of the digital input code have substantially equal and opposite current differences from the desired average current.

* * * * *